United States Patent [19]

Ogura et al.

[11] Patent Number: 5,672,892
[45] Date of Patent: Sep. 30, 1997

[54] PROCESS FOR MAKING AND PROGRAMMING A FLASH MEMORY ARRAY

[75] Inventors: Seiki Ogura, Hopewell Junction; Nivo Rovedo, Lagrangeville; Robert C. Wong, Poughkeepsie, all of N.Y.

[73] Assignee: International Business Machines Corporation, Armonk, N.Y.

[21] Appl. No.: 645,827

[22] Filed: May 14, 1996

Related U.S. Application Data

[62] Division of Ser. No. 477,791, Jun. 7, 1995, Pat. No. 5,541,130.

[51] Int. Cl.[6] ............................................. H01L 21/8247
[52] U.S. Cl. .......... 257/314; 257/315; 257/316; 257/320; 257/321; 257/311; 365/185.26; 365/185.28; 365/185.05; 365/185.33
[58] Field of Search ............ 365/185.01, 185.33, 365/185.26, 185.28, 185.05; 257/314, 315, 316, 320, 321, 311

[56] References Cited

U.S. PATENT DOCUMENTS

| | | | |
|---|---|---|---|
| 4,997,781 | 3/1991 | Tigelaar | 437/43 |
| 5,081,056 | 1/1992 | Mazzali et al. | 437/43 |
| 5,087,584 | 2/1992 | Wada et al. | 437/43 |
| 5,143,860 | 9/1992 | Mitchell et al. | 437/43 |
| 5,173,436 | 12/1992 | Gill et al. | 437/43 |
| 5,267,209 | 11/1993 | Yoshida | 365/218 |
| 5,274,588 | 12/1993 | Manzur et al. | 365/185 |
| 5,276,650 | 1/1994 | Kubota | 365/207 |
| 5,280,446 | 1/1994 | Ma et al. | 365/185 |
| 5,282,160 | 1/1994 | Yamagata | 365/185 |
| 5,294,819 | 3/1994 | Simko | 257/314 |
| 5,313,419 | 5/1994 | Chang | 365/182 |
| 5,369,049 | 11/1994 | Acocella et al. | 437/52 |
| 5,409,854 | 4/1995 | Bergemont | 437/43 |
| 5,480,821 | 1/1996 | Chang | 437/43 |
| 5,521,110 | 5/1996 | Gill | 437/43 |
| 5,541,130 | 7/1996 | Ogura et al. | 437/43 |

OTHER PUBLICATIONS

Serial 9Mb Flash EEPROM for Solid State Disk Applications, Mehroua et al., 1992.
An Asymmetrical Offset Source/Drain Structure for Virtual Ground Array Flash Memory with DINOR Operation, Ohi et al., 1993.

*Primary Examiner*—Viet Q. Nguyen
*Attorney, Agent, or Firm*—Peter W. Peterson; DeLio & Peterson, LLC; Susan M. Murray

[57] ABSTRACT

A process for fabricating a high density memory array. N-type impurities are implanted in a p-type substrate to form continuous rails of diffusion that have a substantially flat contour. Each rail of diffusion defines a corresponding bit line. Each rail defines the source and drain region of each pair of adjacent memory array cells associated with the bit line. In one embodiment, multiple layers of polysilicon are utilized to form a control gate, a floating gate, a source and a drain. In another embodiment, multiple layers of polysilicon are utilized to form an auxiliary gate, a floating gate, a source and a drain. In both embodiments, the polysilicon layers self-aligned to substantially reduce polysilicon layer-overlap so as to minimize parasitic capacitances. Domino and Skippy Domino schemes are used to program and read the memory array cells. Programming may be implemented with channel hot-electron tunneling using relatively low programming voltages thereby realizing faster programming time and closer bit-line spacing.

2 Claims, 10 Drawing Sheets

PROCESS FOR MAKING AND PROGRAMMING A FLASH MEMORY ARRAY

This application is a divisional of Ser. No. 08/477,791 filed Jun. 7, 1995, now U.S. Pat. No. 5,541,130.

BACKGROUND OF THE INVENTION

1. Field of the Invention

The present invention is directed to flash memory array structures.

2. Problem to be Solved

Memory devices typically comprise semiconductor memories organized in rectangular arrays of rows and columns on very-large-scale (VLSI) circuits. The intersection of one row and one column results in a storage element called a "cell". A semiconductor memory is comprised of a variety of such cells. Each cell is capable of storing a binary bit of data. Each column defines a bit line and each row defines a word line. Addresses are assigned to each row or column. In order to write data into, or read data from, a row or column of cells, the desired address is provided in binary-coded form to the input of an address decoder. In response to the binary-coded input, the decoder selects the desired row or column for a write or read operation.

Memory devices such as flash memory arrays are typically comprised of an array configured with NAND-logic or NOR-logic. Such arrays are typically configured as a Manhattan-type structure. NAND-logic arrays have a density that is about twice that of NOR-logic arrays. However, access time is slow in NAND-logic arrays due to the series resistance through the circuitry. Furthermore, complex peripheral support circuits are required for NAND-logic arrays. Additionally, NAND-logic arrays are limited to programming by Fowler-Nordheim tunneling which is a relatively slow process. Fowler-Nordheim tunneling requires the application of a relatively high voltage oil unselected word lines to allow a full bit line bias potential to reach the far end or last device in the array without being reduced by numerous voltage drops (threshold voltage of each device in the chain). Thus, due to this high voltage applied to the unselected word lines, adjacent bit lines must be widely spaced apart thereby impeding the design of high-density memory arrays. NAND-logic arrays are typically limited to 16 (sixteen) devices in series to avoid excessive series resistance. Furthermore, each memory cell of a NAND-logic array requires two (2) extra select gates thereby increasing the manufacturing costs and decreasing the efficiency of NAND-logic arrays.

Manhattan-type structured memory arrays typically utilize a long common diffusion shared by adjacent cells. Such a configuration is conducive to difficulties in programming and reading operations, e.g. reverse programming and read interference. For example, when a bit line is pulled down to a logic "low" level during sensing, it is not always clear whether the bit line is being pulled down by the selected cell or an adjacent cell. Similarly, when an addressed cell is in a nonconducting state, the corresponding selected bit line should be at a logic "high" level. However, the bit line may be erroneously pulled down to a logic "low" level by an adjacent unselected cell. Similar confusion results during programming operations. For example, programming an addressed cell may disturb an adjacent cell. There have been many attempts to solve these problems associated with programming and reading operations. One attempt involves designing each memory cell to have an unsymmetrical configuration. This is accomplished by angle-implanting in one direction of the memory cell so that disturbance from one direction is less than disturbance received from an opposite direction. However, it has been found that the aforementioned problems are only marginally reduced by such a cell configuration. Furthermore, unsymmetrical memory cell configurations require a relatively larger sized memory cell. Another attempt to solve the aforementioned problems is to provide an additional split-gate in order to eliminate the interference. However, this approach also increases the size of the memory cell. A further approach involves the separation of the drain diffusion for memory cells sharing the same word line.

NAND-logic and NOR-logic memory arrays typically utilize multi-polysilicon layers configured in "stacks". However, parasitic capacitances result from overlay tolerances defined by the degree to which one layer overlaps another layer. If the layers overlap one another significantly, significant parasitic capacitances result which have a deleterious effect on the operation of the memory array.

Bearing in mind the problems and deficiencies of the conventional memory arrays, it is an object of the present invention to provide a memory array architecture that provides increased integration density without deteriorating the characteristics of the memory cells therein.

It is another object of the present invention to provide a memory array architecture that minimizes the peripheral component count.

It is a further object of the present invention to provide a memory array architecture that provides a relatively fast access time for read or write operations and which has a relatively low power consumption.

It a yet another object of the present invention to provide a memory array that comprises memory cells that can be programmed and read without causing interference to adjacent memory cells.

It is another object of the present invention to provide a memory array architecture that may be used to realize random-access memories as well as read-only-memories.

Other objects and advantages will be apparent to one of skill in the art from the following description.

Summary of the Invention

The above and other objects and advantages, which will apparent to one skilled in the art, are achieved in the present invention which is directed to, in a first aspect, a process for fabricating an array of memory cells in a substrate, comprising the steps of:

a) forming a raised isolation region on the substrate, the forming step including the steps of:
        growing a first thermal oxide layer over an active region of the substrate, depositing a first conductive layer over the first thermal oxide to form floating gates, and depositing a layer of nitride over the first conductive layer;

b) masking and etching the first conductive layer and the nitride layer to form a plurality of spaced, elongated stacks extending in a first direction;

c) implanting impurities having a conductivity type opposite that of the substrate into the array active area between the stacks to form continuous, elongated diffusion rails extending in the first direction and having a substantially flat contour, the diffusion rails forming spaced bit column lines;

d) growing a second thermal oxide layer over the diffusion rails and the edges of the first conductive layer;

e) depositing a second conductive layer over the second thermal oxide layer to form auxiliary gates;

f) planarizing the second conductive layer so that it is substantially flush with said nitride layer;

g) growing a third thermal oxide layer over the second conductive layer;

h) selectively etching the nitride layer to remove portions thereof covering the first conductive layer so as to expose the first conductive layer;

i) forming a first dielectric layer over the exposed first conductive layer;

j) depositing a third conductive layer over the first dielectric layer;

k) depositing a second dielectric layer over the third conductive layer;

l) patterning the third conductive layer and the second dielectric layer to form word lines; and m) selectively etching the first conductive layer to substantially align the first conductive layer with the third conductive layer and to form field isolation regions.

In a related aspect, the present invention is directed to a process for fabricating an array of memory cells in a substrate, comprising:

a) forming field isolation regions on the substrate;

b) depositing a first dielectric layer on an active array area of the substrate;

c) depositing a first conductive layer over the first dielectric layer to form floating gates;

d) forming a second dielectric layer over the first conductive layer;

e) masking and etching the first conductive layer and second dielectric layer to form a plurality of spaced, elongated stacks of the first conductive layer and the second dielectric layers extending in a first direction;

f) implanting impurities having a conductivity type opposite that of the substrate into the array active areas between the stacks to form elongated diffusion rails extending in the first direction to form spaced apart bit column lines, the diffusion rails having a substantially flat contour;

g) forming a third dielectric layer over portions of the array active area not covered by the first conductive layer;

h) depositing a second conductive layer over the third dielectric layer to form control gates;

i) depositing a fourth dielectric layer over the second conductive layer;

j) masking and etching the second dielectric layer and the second conductive layer followed by masking and etching first dielectric and first conductive layer to align the first conductive layer with the second conductive layer;

k) forming a fifth dielectric layer over the edges of the first and second conductive layers;

l) depositing a third conductive layer over the array active area;

m) depositing a sixth dielectric layer over the third conductive layer; and n) patterning the sixth dielectric and the third conductive layers to form a field shield over the active array area.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1–6 of the drawings in which like numerals refer to like features of the invention.

1) First Embodiment

Figure 1:
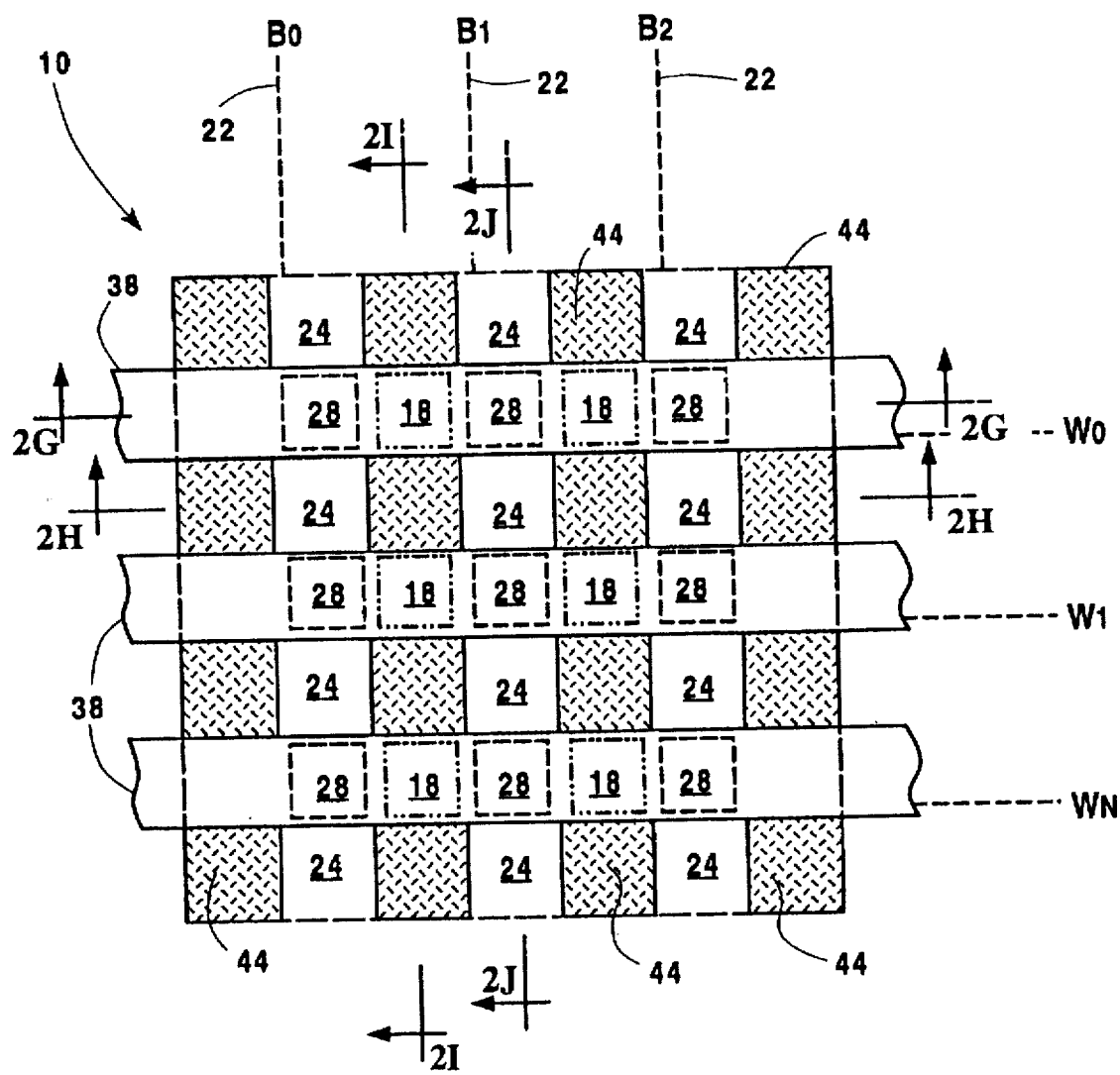
FIG. 1 is a top plan view of one embodiment of the memory array of the present invention.

Referring to FIG. 1, preferred memory array 10 of the present invention comprises a plurality of memory cells disposed in mutually intersecting rows and columns. The columns are connected to bit lines designated B0, B1, B2 . . . ,Bm in the drawings. The rows are connected to word lines designated W0, W1, W2 . . . , Wn. FIG. 1 shows a diagrammatic plan view of memory array structure 10 which is configured in the Manhattan structure. The process for forming memory array 10 will now be discussed in detail in conjunction with FIGS. 1 and 2A–K.

Figure 2A:
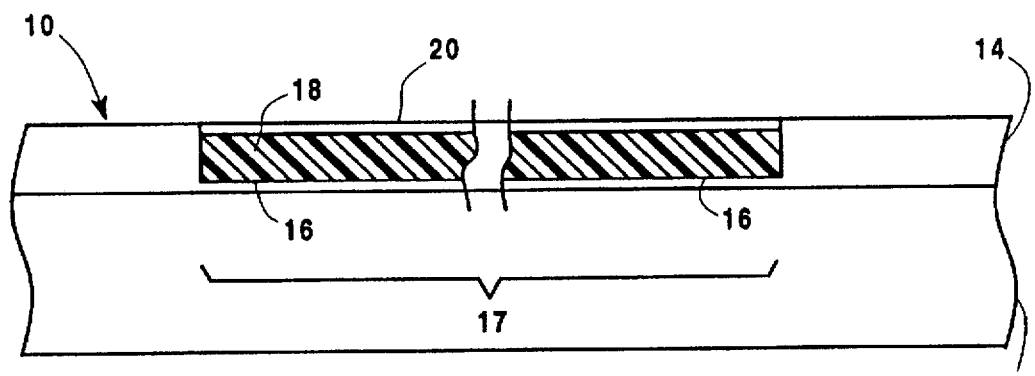
FIGS. 2A–2K are diagrammatic sectional views illustrating various steps of a method for manufacturing the memory array of FIG. 1.
Figure 2B:
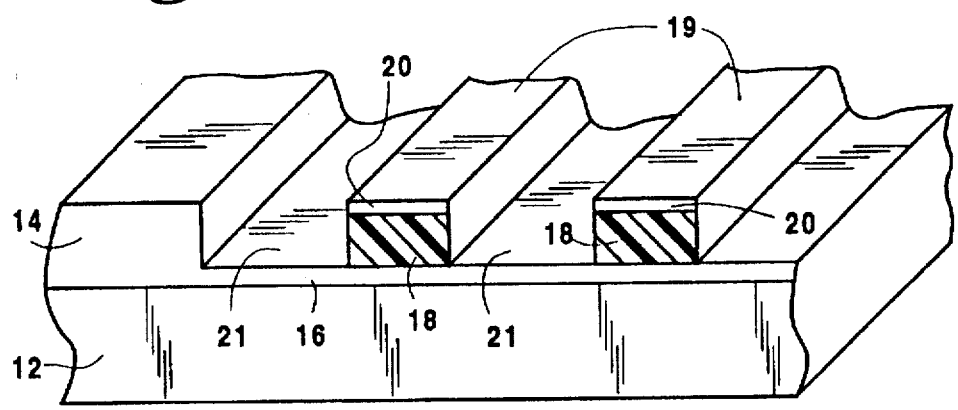
Figure 2C:
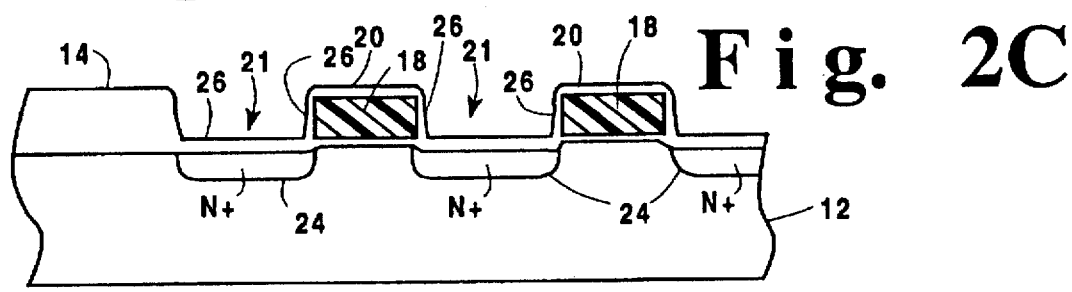
Figure 2D:
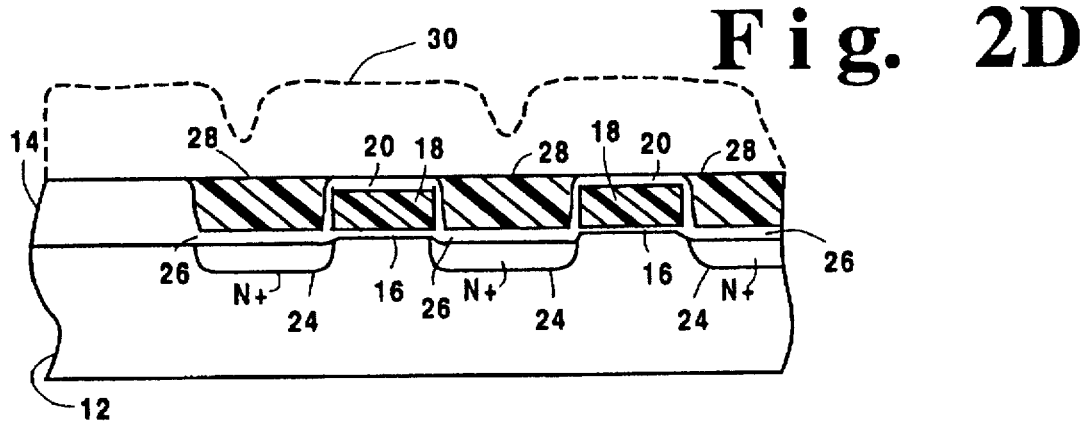
Figure 2E:
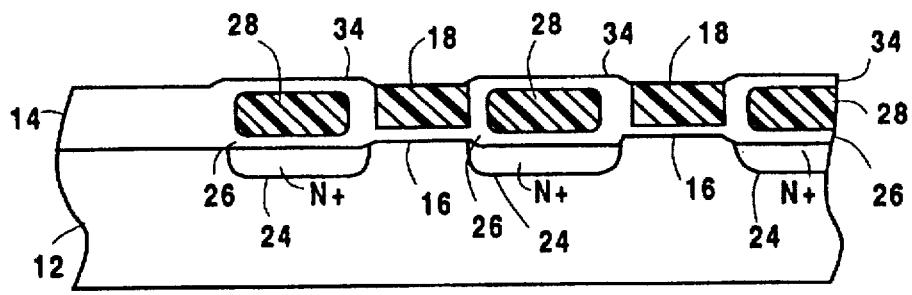
Figure 2F:
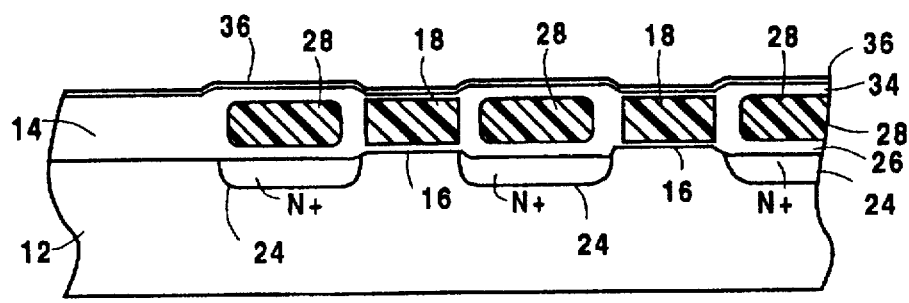
Figure 2G:
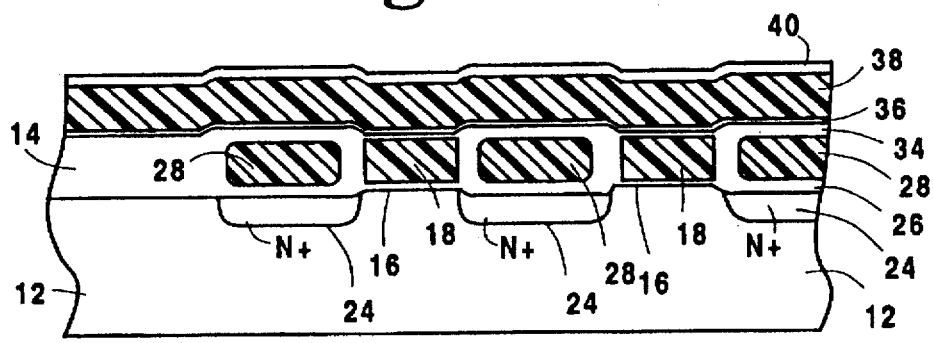
Figure 2H:
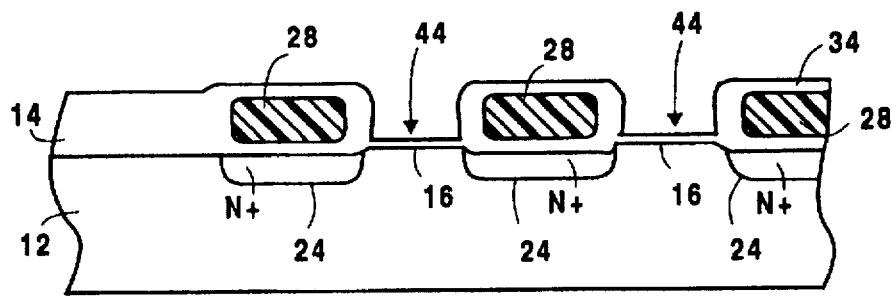
Figure 2I:
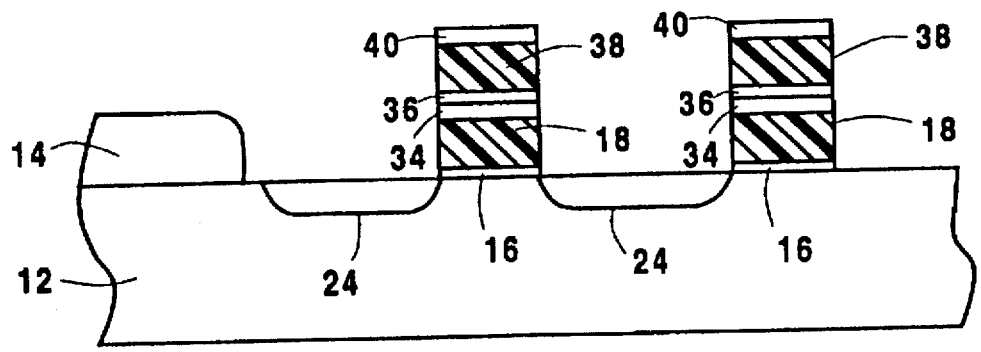
Figure 2J:
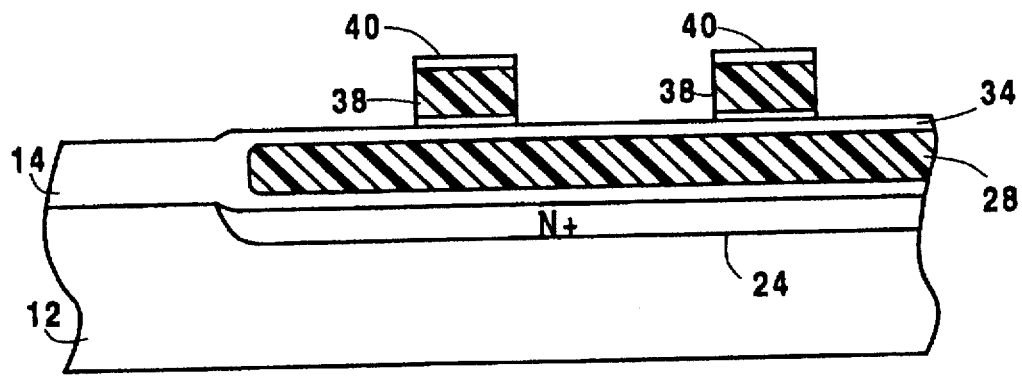
Figure 2K:
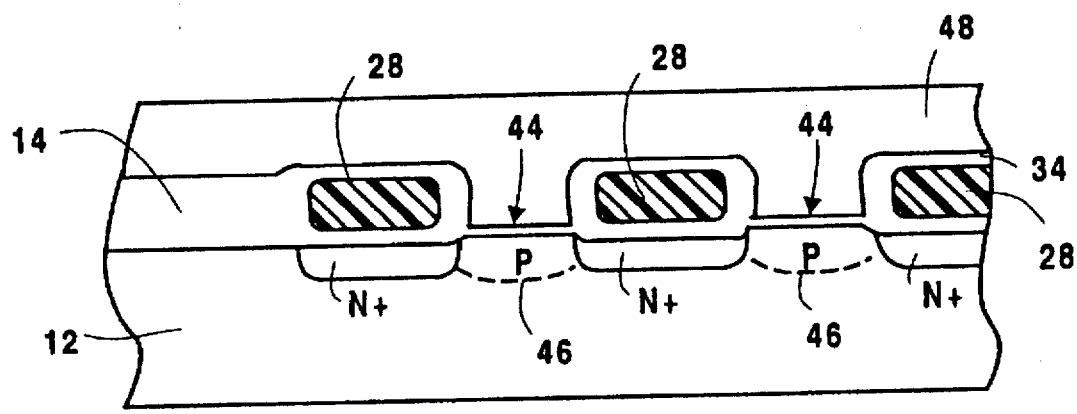

A) Process For Forming First Embodiment a) The first step of the process for forming the first embodiment entails forming raised isolation region 14 on substrate 12 (see FIG. 2A). Preferably, the raised isolation process used is that which is described in commonly owned U.S. Pat. No. 5,369,049, the disclosure of which is incorporated herein by reference. In following the process in the '049 patent, the resulting structure will incorporate a tunneling oxide layer 16 grown over the support circuit regions and the array active region 17. The tunneling oxide layer preferably has a thickness of about 90 A.

b) The resulting structure will also incorporate a first polysilicon layer 18 over tunneling oxide layer 16 to form floating gate 18 (see FIG, 1). Layer 18 preferably has a thickness of about 3000 A.

c) This polysilicon layer 18 has been appropriately doped with phosphorous to a concentration of about $10^{20}$ cm$^{-3}$.

d) A protective layer or cap 20 of nitride has also been incorporated over layer 18 (see FIG. 2A). Preferably, layer 20 has a thickness of about 1500 A.

e) Referring to FIG. 2B, stripes or elongated stacks 19 are cut into the large rectangle comprising first polysilicon layer 18 and nitride layer 20 in the array region using a lithographic mask and a directional etch process which does not substantially etch tunneling oxide layer 16. There are 2 types of devices used in support circuit regions: high-voltage devices and low-voltage devices. The high-voltage devices regions are opened during this process step to remove layers 18 and 20. At the low-voltage device regions, the lithographic mask patterns layers 16 and 20 to form a gate electrode with tunnel oxide layer 16 acting as a gate insulator. This lithographic mask also defines the source and drain regions between stripes 19.

f) Referring to FIG. 2C, a lithographic mask is then used in array active area to dope the stripes or areas 21, between stripes 19, with N+type impurity to form N-type regions 24. This is accomplished by ion implantation. N-type regions 24 have a substantially flat contour that is substantially flush with the top surface of substrate 12. This process step effects formation of diffused bit lines 22 (see FIG. 1).

g) An oxide layer 26 is then grown on the exposed silicon (Si) edges of first polysilicon layer 18 anti on N-type regions 24. Preferably, oxide layer 26 has a thickness of about 400 A. In the low-voltage support circuit regions, the source and drain regions opened by the previous etching mask, and the exposed silicon edges of polysilicon layer 18 are oxidized. In the high-voltage support circuit regions, oxide layer 26 forms a gate oxide layer that has a thickness sufficient to withstand higher voltages.

h) Referring to FIG. 2D, a second polysilicon layer 28 is deposited over N-type regions 24 (in the area defined by stripes 21) created by the etch-mask process of step (e) above. Layer 28 is then doped with phosphorous. Polysilicon layer 28 is then planarized via a chemical-mechanical polishing process such that layer 28 is flush to the top of nitride cap or layer 20. Dotted line 30 represents the surface of second polysilicon layer 28 prior to being planarized. Second polysilicon layer 28 forms the auxiliary gates (see FIG. 1). The auxiliary gates provide isolation or can be used optionally as erase gates. Layer 28 can also form the gate regions of the high-voltage devices. For the low-voltage devices, layer 28 can be used to form contact to the source and drain regions. In this case, prior to depositing layer 28, a mask, open over the drain/source regions, can be used to implant the source/drain regions and to directionally etch the oxide layer over the horizontal surface of the source/drain regions while leaving oxide on the sides of the gates. Polysilicon layer 28 is not electrically coupled to the diffusion rails (source/drain regions).

i) Referring to FIG. 2E, an oxide layer 34 is then grown (through oxidation) over second polysilicon layer 28.

j) Nitride layer or cap 20 on first polysilicon 18 is then selectively removed. A hot, phosphoric acid etching process may be used to remove layer 20 to expose polysilicon layer 18. However, the acid etching process does not affect oxide layer 34 which covers polysilicon layer 28.

k) Referring to FIG. 2F, the exposed first polysilicon layer 18 is now oxidized to form a bottom oxide layer of an ONO interpoly dielectric layer (a combination of silicon dioxide and silicon nitride). The bottom oxide layer preferably has a thickness of about 200 A. A nitride layer, preferably having a thickness of about 70 A is then deposited over the aforementioned bottom oxide layer. An oxidation process is then used to form a thin oxide skin on the nitride layer so as to complete a ONO interpoly dielectric layer 36. ONO layer 36 is designed to be thinner than sealing oxide layer 34 by a factor of approximately two (2) so as to ensure that a sufficient portion of layer 34 remains on layer 28 when layer 34 is exposed to an etching process (described below) that removes ONO layer 36.

l) Referring to FIG. 2G, third polysilicon layer 38 is then deposited over ONO layer 36. Layer 38 is then doped with phosphorus.

m) Referring again to FIG. 2G, polysilicon layer 38 is then capped with a dielectric layer 40.

n) Layers 38 and 40 are then patterned by using a lithographic mask and a directional etch to form the word lines. After layers 38 and 40 are etched, ONO layer 36 is etched. However, layer 34 remains since it is thicker than layer 36, as previously described above.

o) Referring to FIGS. 2H, 2I, and 2J polysilicon layer 18 is then selectively etched to align layer 18 with third polysilicon layer 38 line (layer 18 is self-aligned to layer 38). However, layer 18 is not continuous under layer 38 (or the word lines), since it was segmented by the masking step of step (e) above, forming "islands" of floating gates 18 of polysilicon under the word line. Therefore, a cross-sectional view taken along lines 2H—2H of FIG. 1 is shown in FIG. 2H, and a cross-sectional view taken along line 21—21 of FIG. 1 is shown in FIG. 2I. A cross-sectional view taken along line 2J—2J cuts across several word lines and layer 28 which forms the auxiliary gates, as shown in FIG. 2J.

p) Referring to FIG. 2K, (same view as FIG. 2H) field isolation regions 44 are formed in the array as a result of the previous etching steps. Isolation regions 44 are in low-lying areas and can be doped by a boron implant 46 and oxidized to have an oxide layer to prevent a possible parasitic FET from turning on. Preferably, the oxide layer has a thickness of about 300 A. A dielectric layer 48 is deposited into regions 44. Preferably, layer 48 is a passivating PSG (phosphosilicate glass) layer, and then planarized by processes well known in the art. This step, in conjunction with steps b, e, f and o described above, complete the formation of the channel regions.

The polysilicon layer 28 reduces the word line capacitance by separating third polysilicon layer 38 from the regions 24. Polysilicon layer 28, as an auxiliary gate provides a possible "erase gate" via tunneling between floating gates 18 and polysilicon layer 28.

Figure 5:
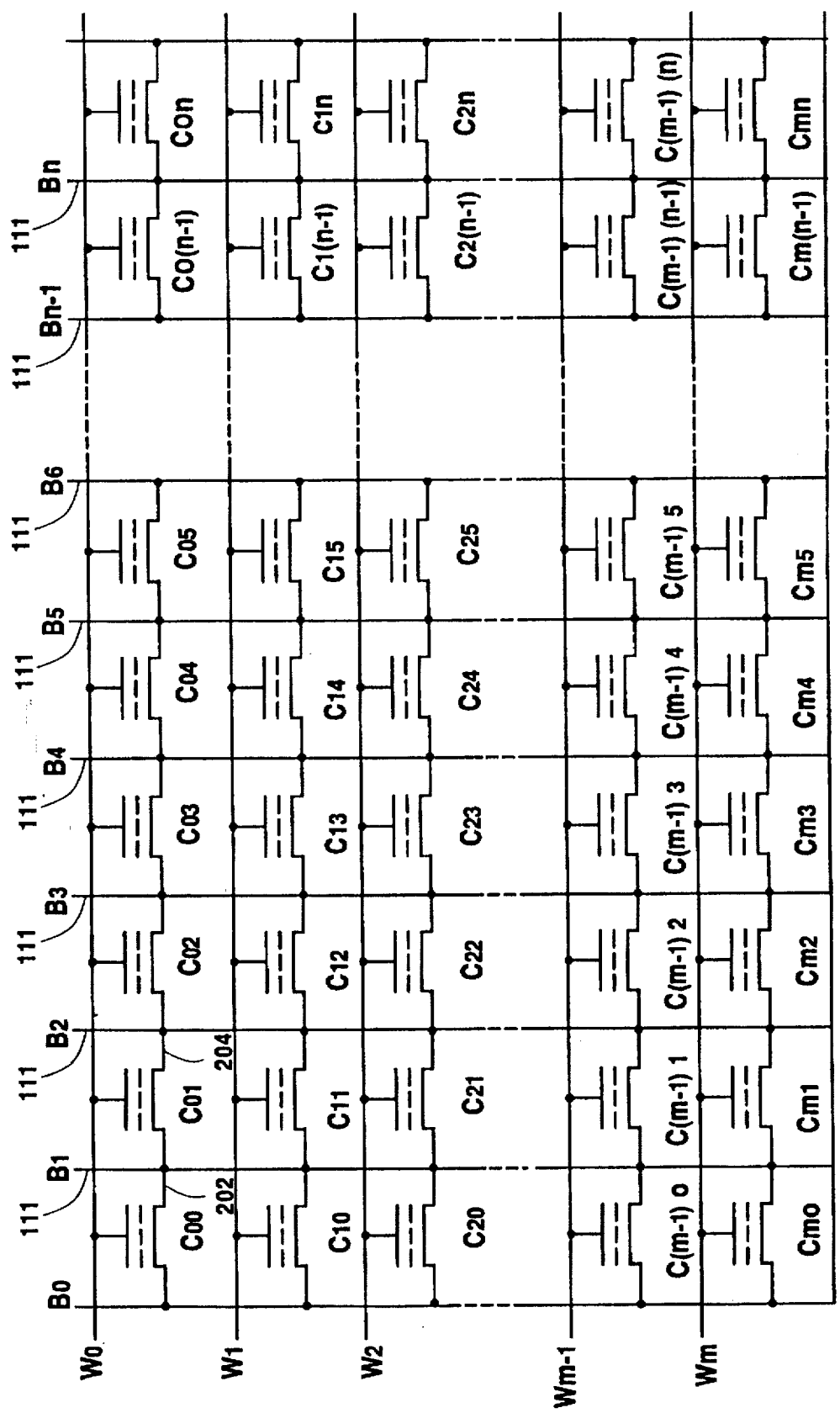
FIG. 5 is a circuit diagram of the memory array of the present invention.

As described above, N-type regions or diffusion rails 24 define the source/drain regions of the array cells and are formed in the areas between each word line 38 by doping N-type impurity into substrate 12. No N-type material is doped directly into the active regions (channel region) underneath the word lines. Each cell comprises a storage transistor having a floating gate, an auxiliary gate, a drain and a source. A unique feature of memory array 10 is that any particular portion of region 24 defines a source and drain of adjacent cells. Thus, memory structure 10 has a memory cell architecture shown in FIG. 5 wherein the source of one cell $C_{nm}$ is also the drain of an adjacent cell and vice-versa. Such a configuration obviates typical polarity problems that occur when the source of one cell is at a different potential than the drain of the adjacent cell. Thus, each bit line 111 (B0 . . . Bn) serves as the drain of one cell and the source of the adjacent cell. For example, B0 serves as the source 202 of cell $C_{00}$ and drain 204 of cell $C_{01}$. Furthermore, as shown in FIG. 5, each bit line, except bit line B0, serves as the source and drain for each pair or adjacent cells in the column defined by that particular bit line. Such a configuration reduces the number of bit lines needed for operation of the array thus providing additional space for additional memory cells.

Furthermore, such a configuration obviates the need for select lines which also contributes to the creation of additional space for additional cells. Thus, this configuration results in a higher density memory array that is relatively less complex in design. Furthermore, the configuration shown In FIG. 5 dissipates relatively less power because unselected cells do not dissipate power because the source of one cell is at the same potential as the drain of the adjacent cell. Each cell shown in FIG. 5 is an EEPROM cell. The dashed line in each cell represents a floating gate.

2) Second Embodiment

Figure 3:
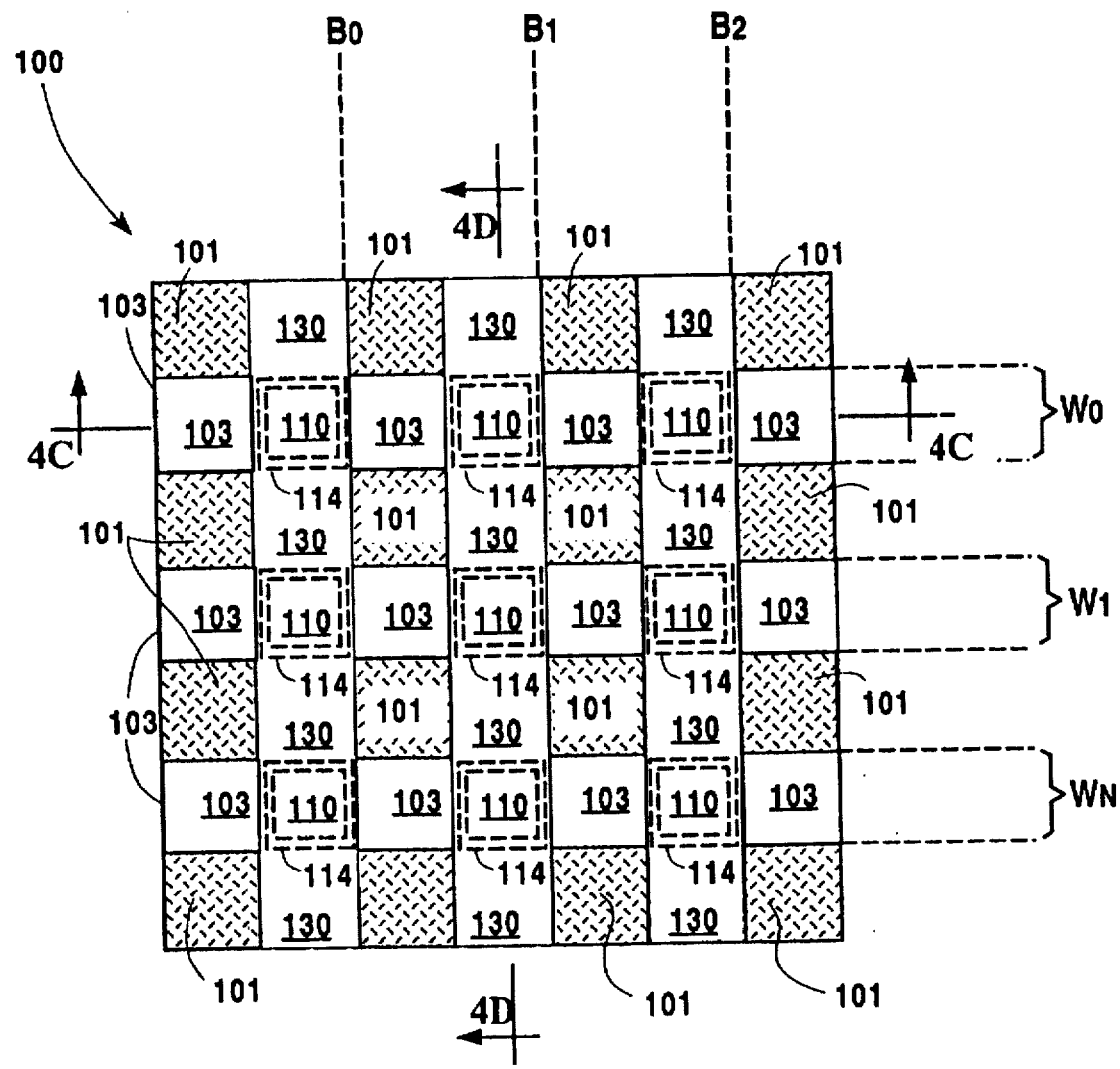
FIG. 3 is a top plan view of another embodiment of the memory array of the present invention.

Referring to FIG. 3, alternate memory array 100 of the present invention comprises a plurality of memory cells disposed in mutually intersecting rows and columns. The columns are connected to bit lines designated B0, B1, B2 . . . .Bm in the drawings. The rows are connected to word lines designated W0, W1, W2 . . . , Wn. Memory array structure 100 is configured in the Manhattan structure. The process for forming memory array structure 100 will now be discussed in detail in conjunction with FIGS. 3 and 4A–4K.

A) Process For Forming The Second Embodiment

Figure 4A:
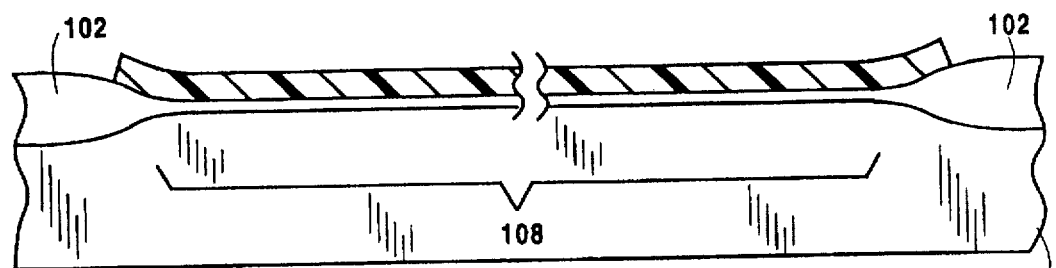
FIGS. 4A–4K are diagrammatic sectional views illustrating various steps of a method for manufacturing the memory array of FIG. 3.
Figure 4B:
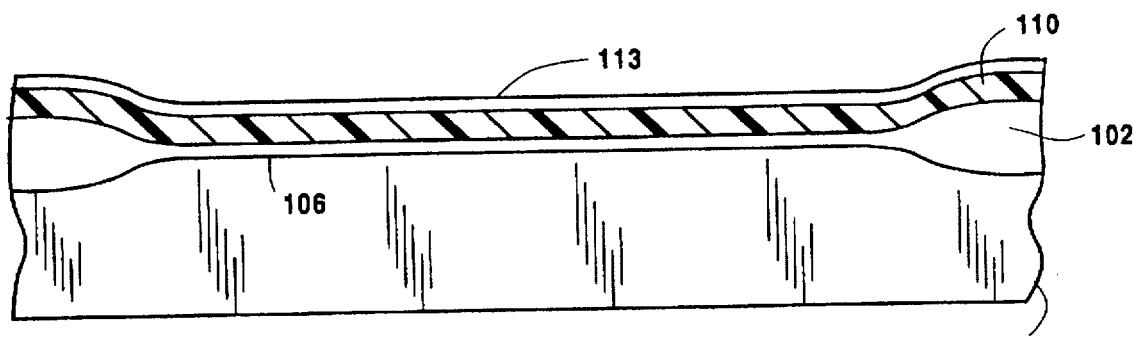
Figure 4E:
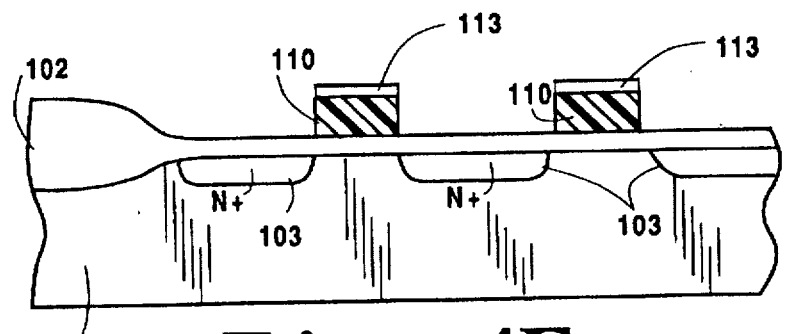
Figure 4F:
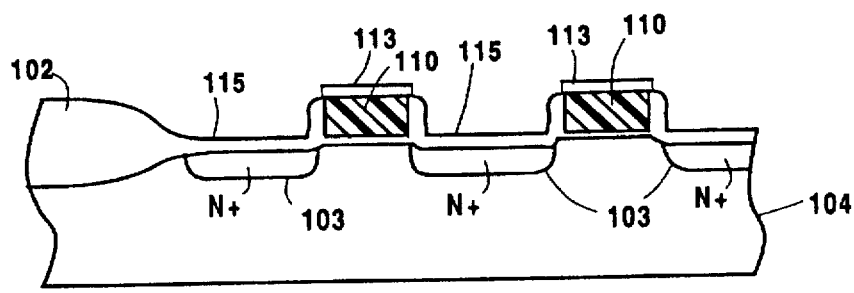
Figure 4C:
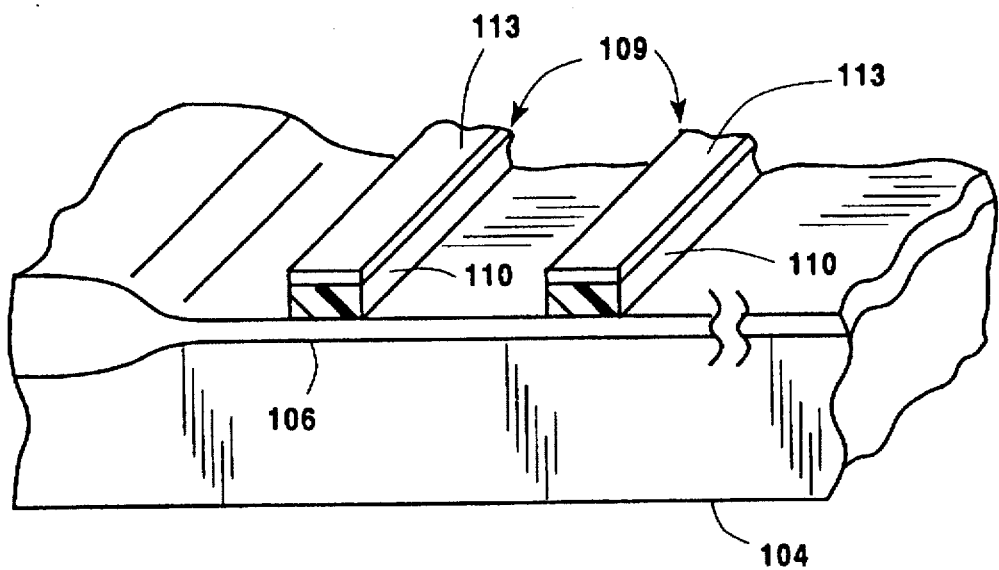
Figure 4D:
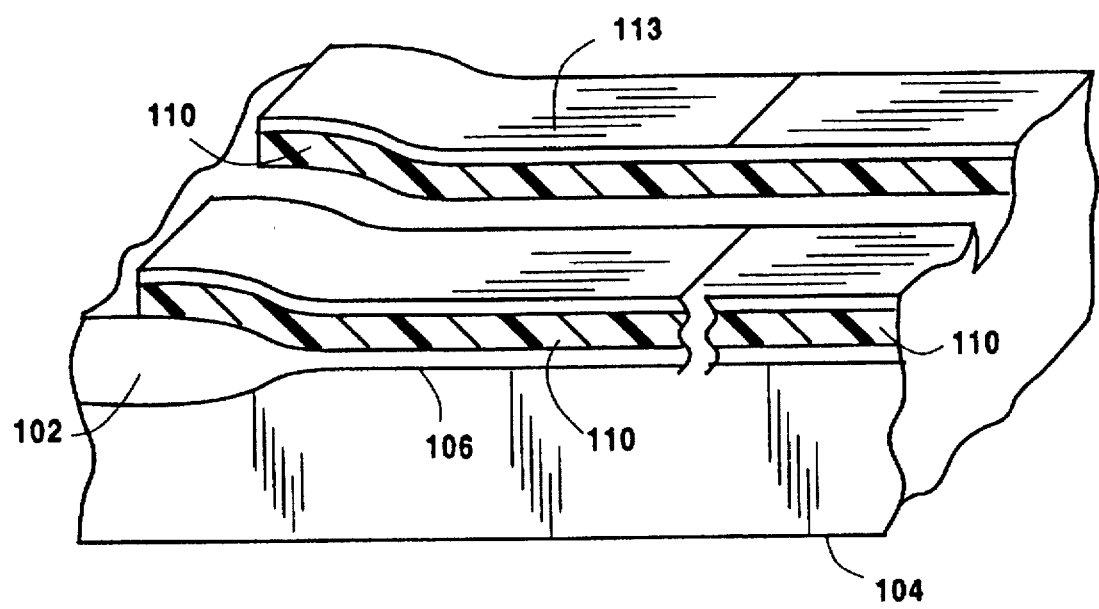
Figure 4G:
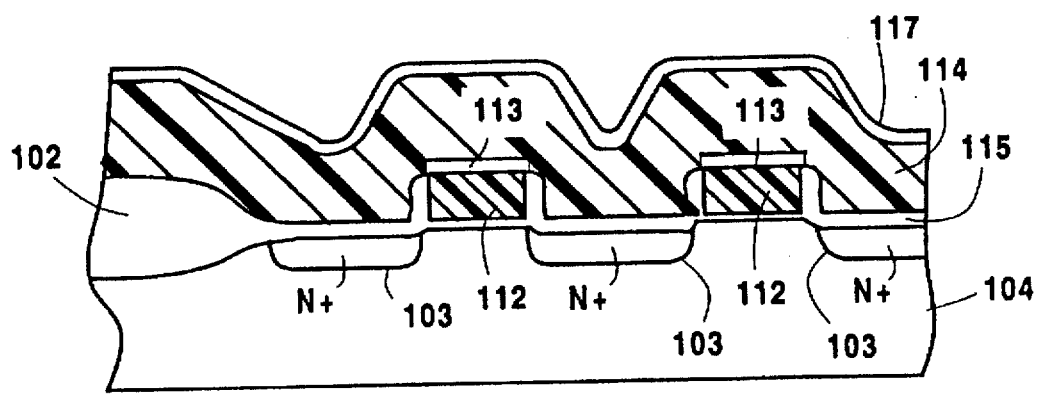
Figure 4H:
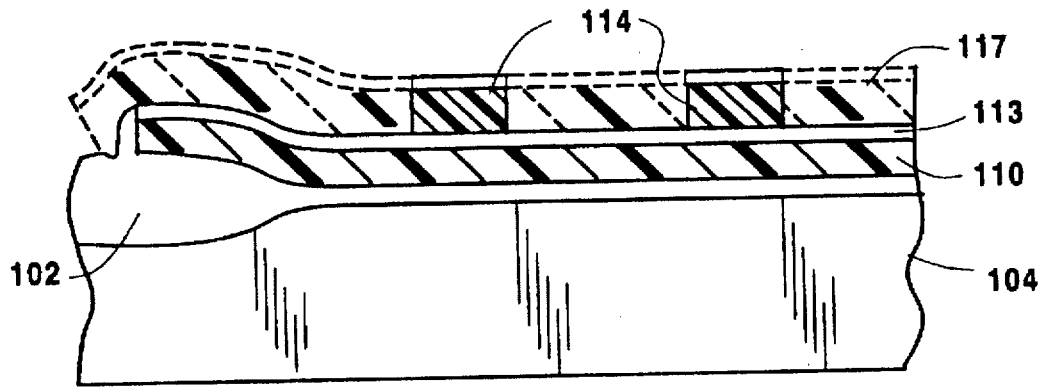
Figure 4I:
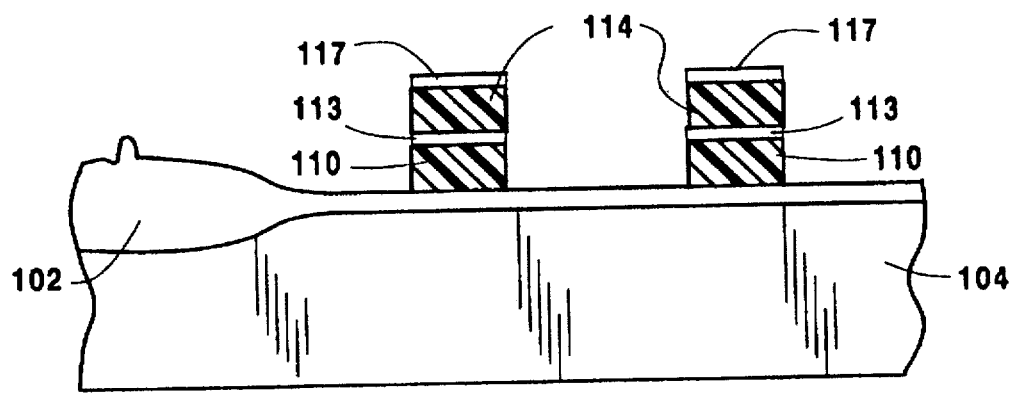
Figure 4J:
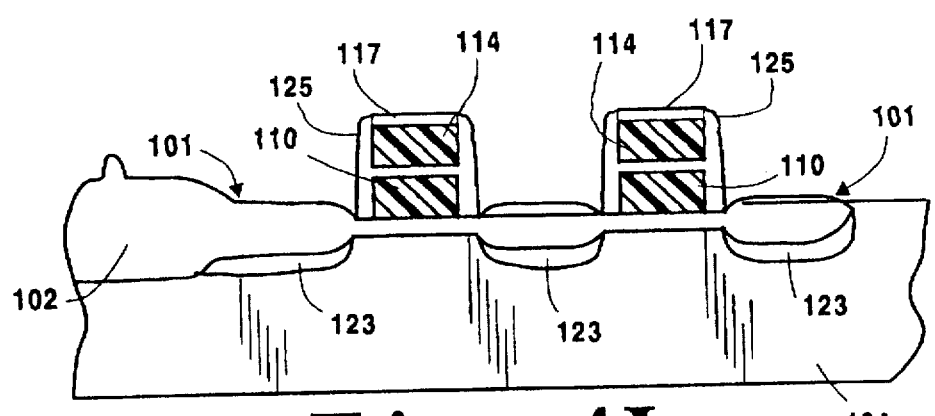
Figure 4K:
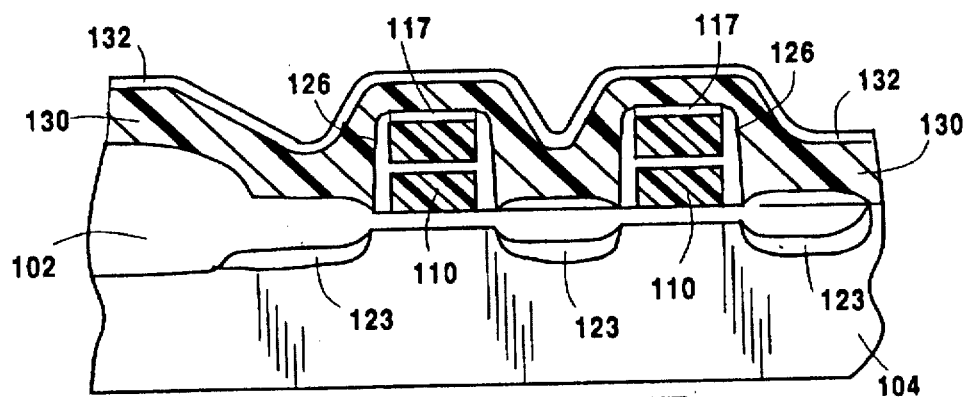

Each step of the process for forming the second embodiment of the memory array of the present invention will now be discussed in detail.

a) Referring to FIG. 4A, a first step of the process entails forming field isolation regions 102 on substrate 104. Standard isolation processes, such as LOCOS isolation or STI isolation, may be used for the support circuits of the memory cell array. If such processes are used, the array is kept as an active area (no field oxide) and nitride is deposited on any area that is not a field isolation region or area.

b) If necessary, the array active areas are masked in order to dope selective areas of the array by ion implantation to adjust cell threshold. This process step is implemented after the completion of the field isolation e.g., after removal of the nitride layer protecting active areas during the formation of the field isolation.

c) The remaining protective films on the device regions are then removed by an etching process. The term "device regions" refers to any device used in a memory cell circuit or a support circuit.

d) Referring to FIG. 4B, a tunneling oxide layer 106 is then grown on active array area or region 108. The tunneling oxide layer preferably has a thickness of about 90 A.

e) Referring to FIG. 4B, first polysilicon layer 110 is then deposited over the tunneling oxide layer 106 to form the floating gates. Polysilicon layer 110 preferably has a thickness of about 1200 A.

f) Referring to FIG. 4B, polysilicon layer 110 is then doped and oxidized to form interpoly, dielectric layer 113. Layer 113 preferably has a thickness of about 250 A. If an oxide-nitride-oxide (ONO) dielectric layer is desired, then a nitride layer is deposited over layer 113. The nitride layer preferably has a thickness of about 70 A.

g) Referring to FIGS. 3, 4C and 4D, dielectric layer 113 and first polysilicon layer 110 are patterned using a lithographic mask and an anisotropic etch technique. A RIE etching technique may be used for the etching process. The etching steps remove all layers of interpoly dielectric and polysilicon from the support circuit regions. Patterning in the array active area 108 effects stripes or elongated stacks 109 of material in a direction perpendicular to the direction of the word lines thus preventing the floating gates from being continuous in the direction parallel to the word line.

h) Referring to FIG. 4E, the array active area is masked and N-type dopant is implanted into substrate 104 to form continuous diffusion rails 103 between and aligned with stripes or stacks 109 of polysilicon layer 110 and layer 113 (the continuous rails of diffusion are self-aligned to stacks 109). Specifically, the continuous diffusion rails are formed by ion implantation of N-type dopant using a photoresist mask. The N-type dopant is not implanted in the portions of the array active area directly under the control gates or word lines, the formation of which is discussed below. Similar to memory array structure discussed above, a unique feature of memory array 100 is that any particular portion of rail 103 defines a source and drain of adjacent cells. This is further discussed below.

i) If desired, any remaining tunneling oxide in regions not covered by polysilicon layer 110 is stripped away.

j) Referring to FIG. 4F, oxide layer 115 is then grown over all portions of array active areas not covered by polysilicon layer 110. This step effects oxidation of the interpoly nitride layer, if such a layer was deposited over layer 113 so that oxide layer 115 becomes an ONO layer. This can only occur if a nitride layer was deposited over layer 113. This step also oxidizes the edges of polysilicon layer 110 not covered by dielectric layer 113. The portion of oxide 115 that covers the continuous diffusion rails that define the source/drain regions and the edges of polysilicon layer 110 preferably has a thickness of about 650 A. The portion of oxide layer 115 that is grown on the undoped regions preferably has a thickness of about 200 A.

k) The next step entails masking and implanting to selectively adjust the threshold of support circuit regions. A mask and etch process is used to remove oxide layer 115 from low-voltage support circuit regions. This oxide is preserved by the mask on the gate regions of the high-voltage support circuits. High-voltage circuits typically require a thicker gate oxide layer than low-voltage support circuits used in logic functions.

l) A low voltage gate oxide is then grown on regions of low voltage support circuits. Thus, the total gate oxide layer of the gate regions of the high-voltage support circuits comprises the previous oxide layer 115 and the oxide layer formed in this step. The total gate oxide layer for the low-voltage support circuits comprises only the oxide layer formed in this step and is therefore thinner than the total gate oxide layer formed over the gate regions of the high-voltage support circuits.

m) Referring to FIGS. 3 and 4G, second polysilicon layer 114 is deposited to form the control gates (also called word lines). For purposes of illustration only, layer 110 is shown in phantom by the dotted box and is underneath layer 114. This drawing is not to scale and as described below, layers 110 and 114 are aligned with one another.

n) Referring to FIG. 4G, polysilicon layer 114 is then doped with phosphorous and covered with a dielectric layer or cap 117 which is preferably comprised of a combination of oxide and nitride.

o) Referring to FIG. 4H, dielectric layer or cap 117 and polysilicon layer 114 are then patterned to form the gate electrode of the cell of the support circuits. The etching step of this layer terminates on the gate oxide layer in the support circuit area. In the array active region, the etching stops on interpoly dielectric layer 113 or on the oxide layer 115 on the continuous diffusion regions (source/drain regions). In order to align (or self-align) polysilicon layer 110 with the edges of polysilicon layer 114, layer 114 is used as a mask for the directional etching of the exposed dielectric layer 113 and polysilicon layer 114. An additional mask is used to protect the support circuits during this etching process. Since the oxide layer on top of the continuous diffusion rails (or source and drain regions) is thicker than the interpoly dielectric, oxide will remain over the source and drain regions after this etching process. Thus, any subsequent etching processes selective to polysilicon will not etch the silicon (Si) of the source/drain regions. Dielectric layer or cap 117 preserves polysilicon layer 114 from being etched away.

p) Referring to FIG. 4K, which illustrates a cross-sectional view similar to FIG. 4D, field isolation regions 101 between floating gates 110 are then implanted to raise the threshold $V_T$ of the parasitic FET thereby improving isolation. Isolation regions 101 are in low-lying areas. A block-out mask is utilized over the support circuit area to accomplish the aforementioned implanting step. Implants 123 are self-aligned with the appropriate areas in the array. Other mask and implantation steps can be used for LDD or other drain engineering as necessary for support circuits or memory cells. This step, in conjunction with steps b, d, e, h and o described above, complete the formation of the channel regions.

q) Referring again to FIG. 4J, a light oxidation forms oxide layer 125 to seal the edges of the stack defined by polysilicon layers 110 and 114. Layer 125 acts as a spacer and facilitates curing any damage sustained at the edges of layers 110 and 114 due to the etching or implantation steps described above. Next, as shown in FIG. 4L, spacers 126 are formed over oxide 125 by a combination of oxide/nitride conformal depositions over the gates followed by an anisotropic etching process.

r) If necessary, the field isolation regions can be further oxidized to have a thickness of about 500 A. The nitride in dielectric layer 117 and sidewall spacer 126 prevents any oxidation of the gate electrode.

s) The source/drain regions of the support devices are then formed using the appropriate masks and implantation process.

t) Referring to FIG. 4K third polysilicon layer 130 is then deposited over the array active area and is appropriately doped with phosphorous.

u) Referring again to FIG. 4K, dielectric layer 132 is then deposited over polysilicon layer 130. Layers 130 and 132 are patterned to form a field shield over the array. This shield is then etched to completely remove portions thereof from the support circuits regions. To implement this etching step, a highly selective, isotropic etch process is used such that no portions of the diffusion rails remain on the edges of the support circuit gates. Preferably, polysilicon layer 130 is biased to ground potential.

As described above, N-type regions or diffusion rails 103 define the source/drain regions of the array cells and are formed in the areas between each word line by doping N-type impurity into substrate 104. No N-type material is doped directly underneath the active area of the word lines. As stated above, a unique feature of memory array 100 is that any particular portion of diffusion rails 103 defines a source and drain of adjacent cells. Each cell comprises a storage transistor having a floating gate, a control gate a drain and a source. Memory structure 100 also has a memory cell architecture shown in FIG. 5 which was described above.

3) Programming and Erasing Operations

An improved method to eliminate reverse programming and read interference, as described above, will now be described.

1. Block Erase

All bit lines B0–Bm are raised to $V_{pp}$, which is about 8 volts for N-channel FET cells, and all word lines W0–4Wn are grounded. Erasure selection can be controlled down to two (2) bits by setting word lines to logic "0" and the selected bit lines BL to $V_{pp}$. Unselected word lines and unselected bit lines are set to about half $V_{pp}$.

2. Domino Program

In order to implement a programming operation, bit patterns must be preset before the word line select to avoid possible disturbs. Table A below shows a program bit pattern for one of n bits. $V_p$ is typically 6.5 volts.

TABLE A

| SELECTED CELL | BIT LINES | | | | | | |
|---|---|---|---|---|---|---|---|
| | B0 | B1 | Bj-1 | Bj | Bj+1 | Bn-1 | Bn |
| cell 0 | VP | 0 | 0 | 0 | 0 | 0 | 0 |
| cell j | VP | VP | VP | VP | 0 | 0 | 0 |
| cell n-1 | VP | VP | VP | VP | VP | VP | 0 |

Only one of n bits is selected for programming by the bit decoders if only one (1) word line is selected. Each time, only one (1) bit line needs to be switched. Multiple bits can be written at the same time if multiple word lines are selected.

3. Read

Table B below shows a read bit pattern for one of n bits. The word line is initially set to logic "0" and raised to $V_{DD}$ when accessed.

TABLE B

| SELECTED CELL | BIT LINES | | | | | | |
|---|---|---|---|---|---|---|---|
| | B0 | B1 | Bj-1 | Bj | Bj+1 | Bn-1 | Bn |
| cell 0 | vdd | 0 | VDD | VDD | VDD | VDD | VDD |
| cell j | VDD | VDD | VDD | vdd | 0 | VDD | VDD |
| cell n-1 | VDD | VDD | VDD | VDD | VDD | vdd | 0 |

When Cell j is selected, Bj is precharged to VDD, while Bj-1 is biased at VDD and Bj+1 is biased at 0 (vdd represents that a cell is precharged to VDD). If cell j is at the '1' state, then Bj will stay up at VDD. If cell j is at the '0' state then Bj will be pulled down. The down level will be clamped to one $V_t$ below VDD by cell j-1, if cell j-1 is at the '0' state, or by the circuitry of a sense amplifier.

The bit line sense signal will be limited to one $V_t$ of the flash cell. However, the swing will be more than enough for conventional sense amplifiers, which only need an input signal swing of about 100 mv. If only one of the n bits is selected at a time, then only one bit column is discharged to ground, while all other unselected columns stay up at VDD. Multiple bit lines can be selected for read operations, however, modifications to the circuitry will be required to implement such an operation.

4) The Domino Access Scheme

In a preferred embodiment, a Domino access scheme is used for both read and write operations and will now be described.

Domino scheme refers to the column (bit line) movement during the access of flash memory arrays, especially those of the Manhattan structure. Access refers to the reading and programming of the flash array. Erasing is generally done for a block of data bits and does not require the fine selection as provided by the Domino scheme.

For programming, bit lines have two possible voltage levels, e.g. GND (ground potential) and VP. In present technologies, VP is between about 4 volts and 8 volts, inclusive. When all bit lines are at GND or at VP, the array is in a standby state such that no operations are being implemented, however, the array is ready for the Domino programming. Domino programming can either start from the all GND state or the all VP state and from the left side of the array or from the right side of the array. If all bit lines are initially set at GND, and programming starts from the left side, and only one word line is selected, the programming of the left-most bit column is carried out by raising the left-most bit column to VP. The pogramming of the next left-most bit column is then carried out by raising the next left-most bit column to VP. This serial rippling will continue from left to right until all bit columns are set to VP.

At this point programming may proceed for the next word line in one of two ways:

(a) Reset all bit columns to GND, and repeat the left-to-right rippling as described above; or (b) Start from the present bit line levels, but ground the right-most bit column to program the right-most bit. After this, most bit columns will be at VP, except for the right-most columns. The next right-most bit is then programmed by applying $V_p$ thereto with the next or succeeding right-most bit column at ground potential. This rippling from the right-to-left will continue until all bit lines are set to GND.

After this, Domino access can then proceed again from left-to-right as described above. This alternate rippling from left-to-right and from right-to-left is referred as the Bit Serpentine Domino Scheme. The Serpentine Domino Scheme is useful for writing a block of data serially at low power dissipation. Power savings is achieved by the quiet operation of single bit line switching.

For programming operations, multiple word lines can be selected to speed up the operations. However, the programming current will limit the number of bits that can be programmed on the same bit columns. Thus, the data input will need to be controlled through the word line voltage levels.

The Domino schemes can be applied to reading as well. The Domino Read Scheme is needed to eliminate the read-interference from adjacent cells in the Manhattan structure. There are two bit line voltage levels, VL and VH. VL is preferably ground potential (GND) and VH is preferably about 1.5 V. However, a bit line selected to be read is set at a level referred to a vh. A bit line set to vh indicates that the bit line is precharged to VH. The bit line is pulled down to VL by the selected cell if such cell has been erased. If the selected cell has been programmed, the bit line remains at VH. Only one word at a time may be selected for read operations instead of multiple words as in the case of programming.

1. Erase

For an erase operation according to the Domino scheme, all bit-lines $BL_n$ are raised to $V_{pp}$, which is preferably about 8 volts, and all word lines are connected to ground potential. Erase-selection can be controlled down to two (2) bits by setting the word line associated with the selected bit to about zero (0) volts and the selected bit lines to $V_{pp}$. Unselected word lines and bit lines can be set to about half $V_{pp}$ which is about 4 volts.

2. Program

The Domino bit pattern for writing a "1" to one (1) of m×n cells per cycle will now be described. For a particular bit pattern, the word line select signal is rippled from $W_0$ to $W_m$. For the next bit pattern, the word line select signal is rippled from $W_m$ to $W_0$ in a serpentine manner. When writing a "0", either the write clock is skipped or the word line select signal is skipped. The serpentine domino write scheme is preferred if power dissipation is to be minimized, since only one word line has to switch anti only one (1) cell is conducting the program current. The Domino bit pattern can be used to write m bits per cycle. In such a scenario, m data bits are used to gate m word lines at the same time. If one (1) of the m-data bits is a logic "0", then the corresponding word line is low or "0"; otherwise, all word lines are high. Thus, up to m "1" bits can be written per cycle with this parallel Domino scheme. Table 1 below shows the Domino bit pattern for writing the cells at various bit columns of FIG. 5.

TABLE 1

| SELECTED CELL | BIT LINES | | | | | | |
|---|---|---|---|---|---|---|---|
| | B0 | B1 | Bj-1 | Bj | Bj+1 | Bn-1 | Bn |
| cell 0 | 0 | VP | VP | VP | VP | VP | VP |
| cell j | 0 | 0 | 0 | VP | VP | VP | VP |
| cell n-1 | 0 | 0 | 0 | 0 | 0 | 0 | VP |

Figure 6:
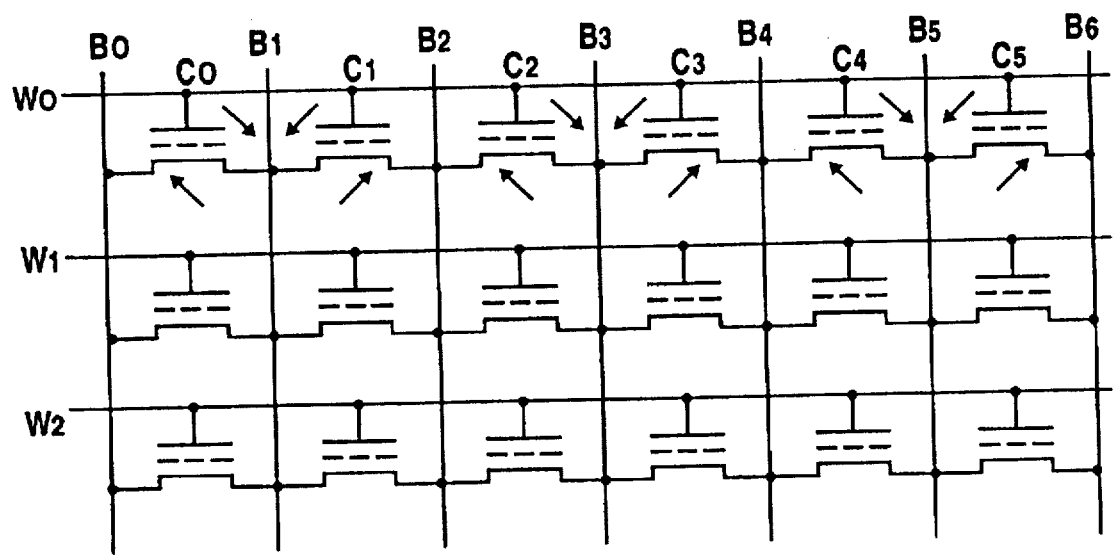
FIG. 6 is a partial view of the circuit diagram of FIG. 5 that illustrates a Skippy Domino write scheme.

Cell i, j is the cell at row i and column j of FIG. 6. When a single word line is selected, one cell is programmed. When multiple word lines are selected, multiple cells are programmed.

TABLE 2

| Domino Program | B0 | B1 | B2 | B3 | B4 | B5 | B6 |
|---|---|---|---|---|---|---|---|
| Cell 0 | VP | 0 | 0 | 0 | 0 | 0 | 0 |
| Cell 1 | VP | VP | 0 | 0 | 0 | 0 | 0 |
| Cell 2 | VP | VP | VP | 0 | 0 | 0 | 0 |
| Cell 3 | VP | VP | VP | VP | 0 | 0 | 0 |
| Cell 4 | VP | VP | VP | VP | VP | 0 | 0 |
| Cell 5 | VP | VP | VP | VP | VP | VP | 0 |

3. Read

The Domino bit pattern for reading one (1) of m×n cells per cycle will now be described. For one bit pattern, the word lines are rippled from $W_0$ to $W_m$. For the next bit pattern, the word line is rippled from $W_m$ to $W_0$ in a serpentine manner. Referring to TABLE 3, $V_L$ and $V_H$ are voltage biases wherein $0 \leq V_L \leq V_H \leq V_{DD}$. $V_L$ is ground potential and $V_H$ is preferably about 1.5 volts. $V_{DD}$ is preferably about 5 volts and $V_h$ represents that a particular cell is precharged to a $V_H$ potential. Each word line select $W_0$ to $W_m$ is initially at $V_L$ and is raised to $V_H$ when that particular word line is accessed. In order to read cell j, cell j-1 is set to $V_L$ and cell j+1 is set to $V_H$, and $B_j$ is precharged to $V_H$. If cell j is a logic "1", $B_j$ remains at $V_H$. If cell j is '0', then $B_j$ is pulled down by the cell. The down level is clamped to one threshold voltage $V_t$ below $V_H$ by either a sense amplifier or by cell j+1 at the logic "0" state.

TABLE 3

| SELECTED CELL | BIT LINES |  |  |  |  |  |  |
|---|---|---|---|---|---|---|---|
|  | B0 | B1 | Bj-1 | Bj | Bj+1 | Bn-1 | Bn |
| cell i 0 | VL | (vh) | VH | VH | VH | VH | VH |
| cell i j | VL | VL | VL | (vh) | VH | VH | VH |
| cell i n-1 | VL | VL | VL | VL | VL | VL | (vh) |

TABLE 3 and FIG. 5, illustrate how the Domino read scheme is used to read a cell at the various bit columns. Cell i, j represents the cell at row i and column j of FIG. 5 wherein i=[0,m].

TABLE 4

| Domino Read | B0 | B1 | B2 | B3 | B4 | B5 | B6 |
|---|---|---|---|---|---|---|---|
| Cell 0 | VL | vh | VH | VH | VH | VH | VH |
| Cell 1 | VL | VL | vh | VH | VH | VH | VH |
| Cell 2 | VL | VL | VL | vh | VH | VH | VH |
| Cell 3 | VL | VL | VL | VL | vh | VH | VH |
| Cell 4 | VL | VL | VL | VL | VL | vh | VH |
| Cell 5 | VL | VL | VL | VL | VL | VL | vh |

5) The Skippy Domino Access Scheme

For stack gate flash cells in the Manhattan structure, programming and erasing may occur on the same side of the diffusion. This is undesirable if a high-voltage diffusion erase process is used. The Skippy Domino scheme avoids same-side erasing and programming. As shown in FIG. 6, the Skippy Domino scheme effects treatment of the array as two sub-arrays, an even sub-array and an odd sub-array, superimposed in the same area.

Two bit columns are switched each time in the rippling. If the even sub-array is to be programmed, the left-most bit column B0 is raised to VP to program cell 0, while all other columns are at GND. Columns B1 and B2 are then raised to VP to program cell 2. Similarly, columns B3 and B4 are raised to VP to program cell 4. On the other hand, if the odd sub-array is to be programmed, B0 & B1 are set to VP to program cell 1, while all other columns are at GND. Similarly, columns B2 and B3 are raised to VP to program cell 3. This procedure continues until the entire odd sub-array is programmed.

TABLE 5

| Skippy Program | B0 | B1 | B2 | B3 | B4 | B5 | B6 |
|---|---|---|---|---|---|---|---|
| Cell 0 | VP | 0 | 0 | 0 | 0 | 0 | 0 |
| Cell 2 | VP | VP | VP | 0 | 0 | 0 | 0 |
| Cell 4 | VP | VP | VP | VP | VP | 0 | 0 |
| Cell 1 | 0 | 0 | VP | VP | VP | VP | VP |
| Cell 3 | 0 | 0 | 0 | 0 | VP | VP | VP |
| Cell 5 | 0 | 0 | 0 | 0 | 0 | 0 | VP |

The row index i is omitted here for simplicity. Block erase is accomplished by raising $B_1$, $B_3$ ... to $V_{pp}$, while $B_0$, $B_2$, ... and all word lines are kept at GND.

Skippy domino scheme is not necessary for read operations, but it may be used just to simplify the overall memory array design.

Thus, the memory array architecture of the present invention provides a memory that:

(a) utilizes three (3) self-aligned polysilicon layers that results in a relatively more compact memory array. Furthermore, the self-alignment feature obviates overlay tolerances. Additionally, the self-alignment feature minimizes the overlap of one polysilicon layer with respect to another thereby minimizing parasitic capacitances which directly affect memory array performance;

(b) has the performance and design simplicity of the NOR-logic memory arrays and higher density than the NAND-logic memory;

(c) has bit lines connected by the highly doped source/drain implants thereby allowing metal stitching to be implemented at distance greater than sixteen (16) devices. Thus, the amount of metal stitching per memory array is reduced allowing for a higher density memory array design;

(d) does not utilize select gate devices thereby allowing for:
   (i) closer bit-line spacing;
   (ii) an increase in the number of memory cells per array thus providing higher density; and
   (iii) a decrease in power dissipation;

(d) programming with channel hot-electron tunneling using relatively low programming voltages thereby affecting faster programming limb and closer bit line spacing; and (e) a relative decrease in manufacturing costs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,

What is claimed is:

1. An array of memory cells, comprising:
   a substrate having a first conductivity type;
   a plurality of elongated stacks extending in a first direction, each stack including:
      a first thermal oxide layer disposed over an active region of said substrate, and
      a first conductive layer disposed over said first thermal oxide to form floating gates, said stacks defining isolation regions;
   a plurality of continuous, elongated diffusion rails implanted in said active array area of said substrate and between said stacks, said rails extending in said first direction and having a substantially flat contour, said rails comprising impurities having a second conductivity type opposite that of said substrate, each diffusion rail defining a bit-column line and a source region and a drain region of each pair of adjacent array cells associated with the bit-column line;
   a second thermal oxide layer disposed over said diffusion rails and the edges of said first conductive layer;
   a second conductive layer disposed over said second thermal oxide layer to form auxiliary gates, said second conductive layer having a top surface substantially flush with said first conductive layer;
   a third thermal oxide layer over said second conductive layer;

a first dielectric layer disposed over said first conductive layer; and a plurality of word lines, comprising:

a third conductive layer disposed over said first dielectric layer, said first conductive layer being substantially aligned with said third conductive layer, and a second dielectric layer disposed over said third conductive layer.

2. The array of memory cells of claim 1 wherein the array comprises N-bit lines and M-bit lines.

* * * * *